United States Patent [19]
Endo et al.

[11] Patent Number: 5,117,204
[45] Date of Patent: May 26, 1992

[54] PHASE LOCKED LOOP CIRCUIT

[75] Inventors: Tadashi Endo; Yasuhiko Sakamoto, both of Tsukuba; Haruo Yoshida, Gyoda, all of Japan

[73] Assignees: Agency of Industrial Science and Technology; Advantest Corporation, both of Tokyo, Japan

[21] Appl. No.: 708,758

[22] Filed: May 31, 1991

[30] Foreign Application Priority Data

Jun. 6, 1990 [JP] Japan .................................. 2-147625

[51] Int. Cl.⁵ .............................................. H03L 7/00
[52] U.S. Cl. .......................................... 331/8; 331/17; 331/107 G
[58] Field of Search ..................... 331/2, 8, 17, 18, 25, 331/34, 46, 47, 55, 107.6, 175, 186

[56] References Cited

U.S. PATENT DOCUMENTS 3,736,527 5/1973 Longacre, Jr. ................. 331/186 X
5,043,677 8/1991 Tomassetti et al. ..................... 331/2

Primary Examiner—Robert J. Pascal
Attorney, Agent, or Firm—Staas & Halsey

[57] ABSTRACT

By using an EIP source lock counter, a frequency of a Gunn oscillator is stabilized. This increases the frequency stability of a circuit. An oscillation output of the Gunn Oscillator is supplied to the EIP source lock counter, and a phase lock signal indicative of a phase shift of the oscillation frequency from the EIP source lock counter relative to a preset reference frequency is supplied to a driver circuit. The driver circuit includes level shift circuit which level-shifts the phase lock signal thereof. A phase compensation circuit in the driver circuit boosts a gain as well as advances a phase at a high frequency region. The current amplifier circuit amplifies a current amplitude of the output of the level shift circuit, and the amplified output therefrom controls an oscillation frequency of the Gunn oscillator using negative feedback.

6 Claims, 12 Drawing Sheets

PHASE LOCKED LOOP CIRCUIT

BACKGROUND OF THE INVENTION

This invention relates to a phase locked loop circuit which stabilizes an oscillation frequency of the oscillator utilizing the super high frequency diode such as a Gunn diode or an IMPATT diode by the PLL method using a source lock counter EIP578B made by EIP.

As shown in FIG. 1, the Josephson junction array voltage standard is obtained as follows:

The Josephson array 2 is put in a liquid helium container 1, to which an electromagnetic wave of millimeter wave is applied from an oscillator (Gunn oscillator) 11 using a Gunn diode, and in consequence, a voltage determined by the frequency of the millimeter wave thereof is generated which is the Josephson array voltage standard.

The oscillation frequency of the Gunn oscillator is stabilized by a phase locked loop circuit. The phase locked loop circuit, as shown in FIG. 1, is designed in such a way that the oscillation output of the Gunn diode 11 is supplied, through a directional coupler 3, to a source lock counter 12, and the output of the source lock counter 12 is, through a driver circuit 21, supplied to the Gunn oscillator 11 for the negative feedback control of the oscillator frequency of the Gunn oscillator 11. The EIP578B made by EIP is the only device commercially available as a source lock counter 12 to be used in the phase locked loop circuit for the high frequency (millimeter wave) oscillator described above, and the EIP578B is normally used, as the source lock counter 12, in the phase locked loop circuit for the Gunn oscillator for the conventional Josephson junction array voltage standard.

The source lock counter 12, EIP578B, is arranged as shown in FIG. 1. Namely, the oscillation output of the Gunn oscillator 11 is supplied to a frequency converter 13 in the source lock counter 12, and the oscillation output of a local oscillator 14 is frequency multiplied at a frequency multiplier circuit 15 the output of which is supplied to the frequency converter 13, in which the oscillation output from the Gunn oscillator 11 is converted to an intermediate frequency signal. The oscillation output converted to the intermediate frequency is supplied to a phase comparator 16 in which its phase is compared with a reference signal from a reference signal source 17. The output of the phase comparator is attenuated in a loop attenuator 18, and is supplied to a driver circuit 21 through a loop filter 19 as an error signal. In order to make the error signal thereof zero, the oscillation frequency of the Gunn oscillator 11 is controlled by a feedback with the output of the driver circuit 21, and is kept constant based on the reference signal from the reference signal source 17.

A time base 22 with an atomic frequency standard such as a rubidium (Rb) frequency standard supplies a reference clock RCK to the source lock counter 12, and the source lock counter 12 functions based on the reference clock RCK. The oscillation output of the local oscillator 14 is made from the reference clock RCK, and likewise, the reference signal of the reference signal source 17 is also made from the reference clock RCK. The frequency of the reference signal is tunable externally, and a multiplying value n of the frequency multiplier 15 is also changeable externally.

Conventionally, a 3-terminal regulator 23 is used for the driver circuit 21 as shown in FIG. 2. A bias voltage of 15 V is supplied to the 3-terminal regulator via a bias terminal 24, and the output of the source lock counter 12 (the output from the loop filter 19) is supplied to an adjust terminal 25 of the 3-terminal regulator 23.

The phase lock signal (error signal) of a center voltage, 0 V, from the loop filter 19 is converted, at the 3-terminal regulator 23, to a signal of a center voltage, 10 V, being a center which is output from the output terminal 26 of the 3-terminal regulator 23, and then supplied to the Gunn oscillator 11. That is, the control signal for the Gunn oscillator 11 requires for example, 10 V, 200 mA for the center frequency of 94 HGz, which is obtained at the driver circuit 21 from the signal of zero center voltage from the loop filter 19. As mentioned above, the voltage of the control signal for the Gunn oscillator 11 is high, and the current is also large, so that the 3-terminal regulator 23 often used for an adjustment (stabilization) of the power supply has been conventionally used as the driver circuit 21.

FIG. 3 shows a Bode diagram where curves 4 and 5 respectively represent gain characteristic and phase characteristic of the source lock counter 12 of EIP578B (hereinafter referred to as EIP source lock counter) the bandwidth of which is selected to be 10 KHz. When a GMR 3-terminal regulator made by Millitech is used for the driver circuit 21, the compound bode diagrams, for the overall gain and phase characteristics of the GMR 3-terminal regulator and the EIP source lock counter become as shown by curves 6 and 7 in FIG. 3, respectively. It is seen from the curves in FIG. 3 that when the 3-terminal regulator is used for the driver circuit 21, the slope of curve 6 becomes slightly steeper at around 10 KHz and the gain drops comparatively steeply above approximately 10 KHz. In addition, the delay of a phase develops compared to the frequency response characteristic for a phase of the EIP source lock counter alone. The phase delay becomes larger as a frequency becomes higher. The phase delay is approximately 150° at and above 10 KHz, and a phase allowance is only about 30°.

Concerning a phase locked loop circuit (PLL), a damping factor $\zeta$ is defined (for example, FLOYDM, GARDNER "Phaselock Techniques", John Wily & Sons, 1966). It is known that the damping factor $\zeta$ is 0.707 for an optimum response. The frequency at a point where the frequency response curve of the loop filter makes a gain change at a lower frequency side is expressed as $1/\tau_1$, the frequency at a point where the frequency response curve of the loop filter makes a gain change at a higher frequency side is expressed as $1/\tau_2$, and the phase detection gain factor and the control gain of the voltage controlled oscillator is expressed as Kd and Ko, respectively. The damping factor $\zeta$ when an active filter is used, in a secondary response loop, as a loop filter, will be defined as expressed in the following equation.

$$\zeta = \frac{\tau_2}{2}\left[\frac{K_o K_d}{\tau_1}\right]^{\frac{1}{2}}$$

The phase detection gain factor Kd of the EIP source lock counter 12 is 8.75 V/$\pi$ rad, and the values of loop filter $\tau_1$ and $\tau_2$ are respectively 1/30 sec. and $1/10^4$. The voltage control gain Ko in response to a frequency of the Gunn oscillator 11 can be expressed as $1.68 \times 10^8 \times 2\pi$ (rad/sec)/V, then the damping factor $\zeta$ of the phase locked loop circuit shown in FIG. 1 is 4.7, which proves that it is significantly greater than the optimum value of 0.707.

Therefore, it is required to make the damping factor smaller, and it is conceivable, in accordance with the conventional technology, to optimize the damping factor by normally selecting the appropriate values for $\tau_1$ and $\tau_2$ of the loop filter. However, on the premise that the EIP source lock counter commercially available in the market is selected from an economical view point, it is difficult to change the values of $\tau_1$ and $\tau_2$ of the loop filter.

As described above, since the 3-terminal regulator is used in the phase locked loop circuit for the Gunn oscillator 11, and the overall characteristic is inferior to the characteristic of the EIP source lock counter alone, and the damping factor $\zeta$ is significantly larger than the optimum value, the frequency stability attained is approximately only $5 \times 10^{-8}$ when a frequency deviation develops to a degree as indicated in FIG. 4. FIG. 4 is based on the 3-terminal regulator made by Millitech as described above and the Gunn oscillator 11 is GDM-10-4-18H, made by Millitech.

The objective of this invention herein is to offer the phase locked loop circuit for a SHF diode oscillator with higher frequency stability than conventional ones, using the EIP source lock counter.

SUMMARY OF THE INVENTION

In accordance with this invention herein, the phase locked loop circuit is configured as follows:

The oscillation output of a SHF diode oscillator such as a Gunn or IMPATT diode is input to an EIP source lock counter. A phase difference between a signal corresponding to the oscillation output thereof and a reference frequency signal set in the EIP source lock counter thereof is detected. The error signal (phase lock signal) corresponding to the phase difference is output from the EIP source lock counter, and the oscillation frequency of the SHF diode oscillator is controlled by a feedback of the error signal through a driver circuit. The driver circuit comprises a level shift circuit to shift the input level of the error signal and a current amplifier circuit which amplifies the current of the level-shifted error signal described above to supply same to the SHF diode oscillator as a control signal. Both the level shift circuit and the current amplifier circuit use high frequency transistors. Additionally, a phase compensation circuit is provided to increase a gain as well as to advance a phase in the high frequency region compared to the low frequency region.

DESCRIPTION OF THE PREFERRED EMBODIMENT

An explanation will be given for a case in which this invention is applied to a phase locked loop circuit for a Gunn oscillator.

Figure 1:
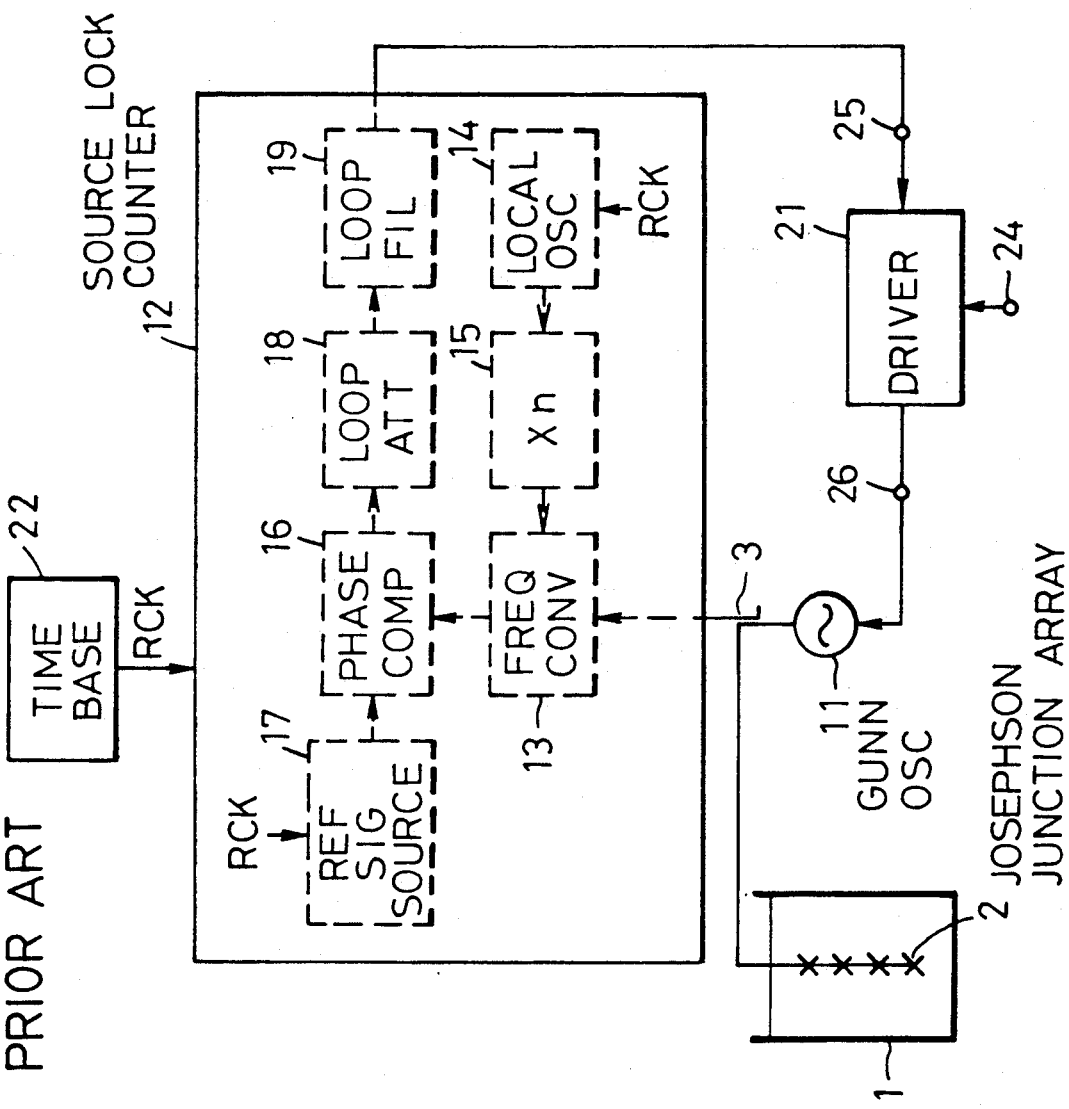
FIG. 1 is a block diagram of a phase locked loop circuit for a conventional Gunn oscillator.
Figure 2:
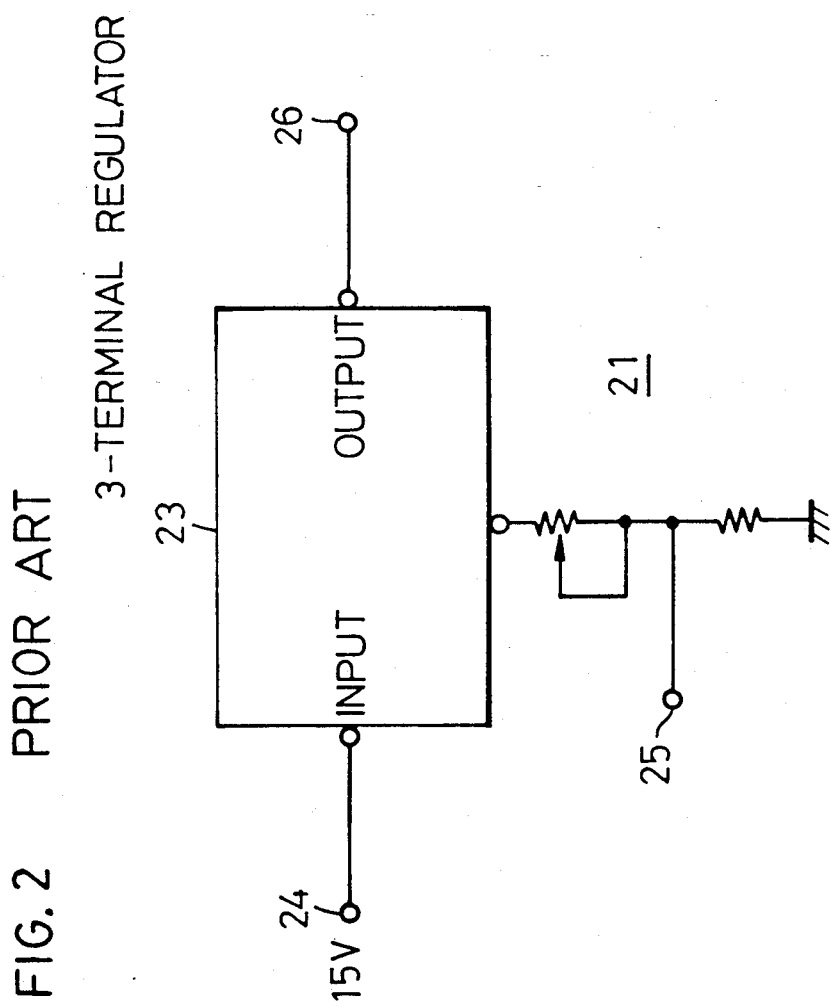
FIG. 2 is a driver circuit in FIG. 1.
Figure 5:
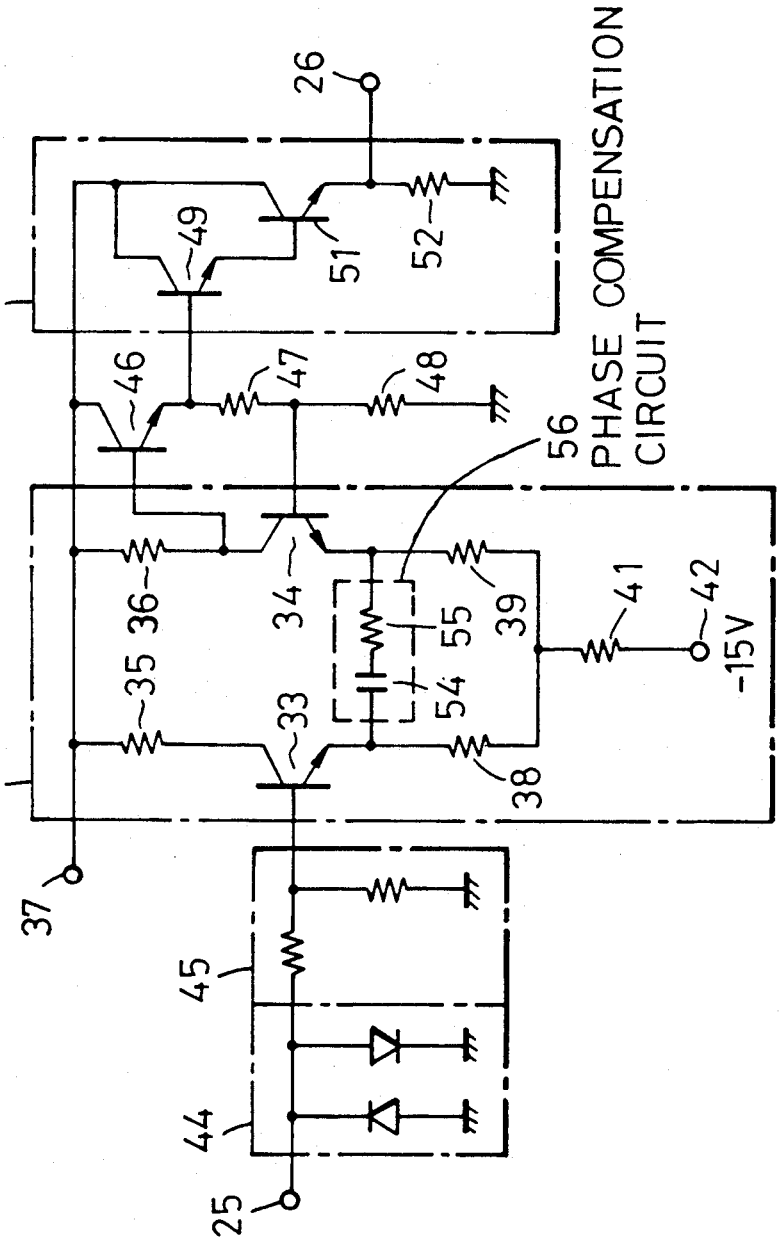
FIG. 5 is a detailed schematic diagram for the driver circuit showing the principal part of an embodiment according to the invention.

Although an overall configuration of this invention is similar to the one shown in FIG. 1, the driver circuit 21 in the present invention includes as shown in FIG. 5, a level shift circuit 31 and a current amplifier circuit 32 for amplifying an output from the level shift circuit 31. In this example, the level shift circuit 31 is designed in such a way that the collectors of low noise, high frequency transistors 33 and 34 are connected through the resistors 35 and 36, respectively, to a positive power supply terminal 37 powered with +15 V, and the emitters are connected to each other through respective resistors 38 and 39 which are connected, through the resistor 41, to a negative power supply terminal 42 powered with −15 V; the phase lock signal (error signal), namely the output from the loop filter 19 in FIG. 1, is supplied to a base of the transistor 33 from a terminal 25 through a limiter 44 and also an attenuator 45; and the collector of the transistor 34 is connected to the base of the low noise high frequency transistor 46, and the collector of the transistor 46 is connected to the power supply terminal 37, and its emitter is grounded through resistors 47 and 48 connected together at a junction connected to the base of the transistor 34.

A current amplifier circuit 32 is constructed by low noise, and high frequency transistors 49 and 51 which are connected to each other in the form of a Darlington circuit. The collectors of the transistors 49 and 51 are directly connected to each other and are connected to the power supply terminal 37. The emitter of the transistor 49 is connected to the base of the transistor 51, and the emitter of the transistor 51 is grounded through a resistor 52 and is also connected to an output terminal 26. The emitter of the transistor 46 is connected to the base of the transistor 49, and the output terminal 26 is connected to the control terminal of the Gunn oscillator (not shown in the drawing).

Additionally in this embodiment, the phase compensation circuit 56 comprising a capacitor 54 and a resistor 55 connected in series, is connected between the emitters of the transistors 33 and 34 of the level shift circuit 31. The transistors 33, 34, 46 and 49, have a cutoff frequency of approximately 300 MHz, and are, for example, 2SC400Y made by Toshiba, and the transistor 51 which drives has large current, a a cutoff frequency greater than 100 MHz, and is, for example, a 2SC2098 made by Toshiba.

In order to produce 10 V at the output terminal 26 when the input terminal 25 is held at 0 V, a value for each part in the level shift circuit 31 is properly selected to produce, at the collector of the transistor 34, a voltage of 12.1 V which is higher than 10 V by the total sum of the voltage drops between the bases and the emitters of the transistors 46, 49 and 51. The phase compensation circuit 56 boosts up a gain in a high frequency region as well as advances a phase.

According to the configuration described above, the phase lock signal from the input terminal 25 is level-shifted at the level shift circuit 31 from approximately 0 V to about 10 V. The level-shifted signal thereof is impedance converted at the transistor 46, and current-amplified as well as impedance-converted at the current amplifier circuit 32. Thus driving the Gunn Diode of the Gunn Oscillator at approximately 10 V and 200 mA. This driving signal changes in response to the phase lock signal, and performs a feedback control to maintain the oscillation frequency at a constant.

Figure 6A:
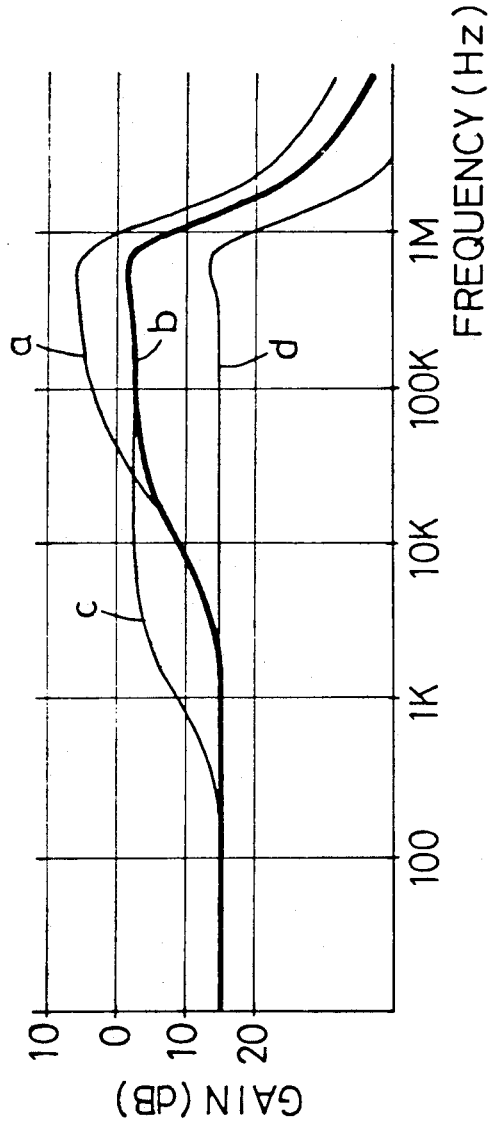
FIG. 6A is an open loop frequency response characteristic curve of the gain for the circuit illustrated in FIG. 5.
Figure 6B:
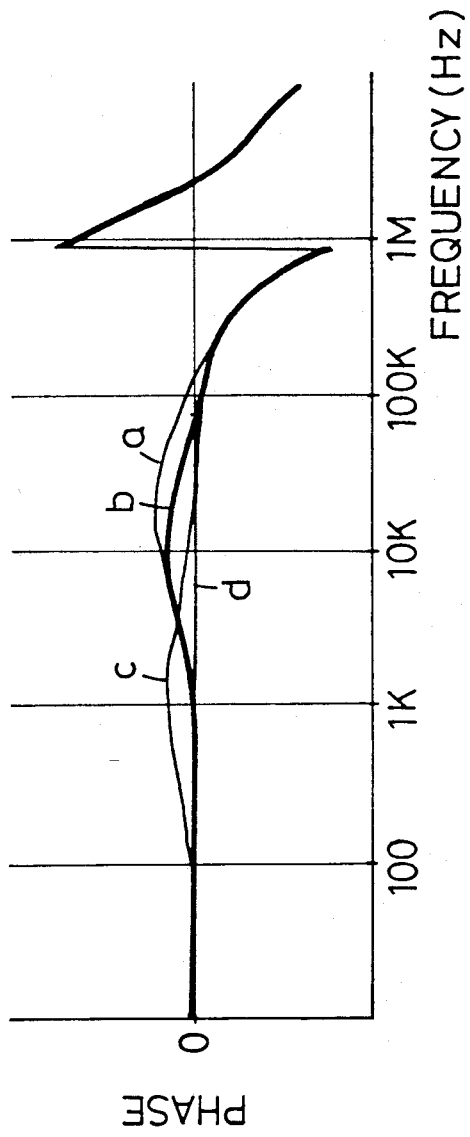
FIG. 6B is a frequency response characteristic curve of the phase for the circuit illustrated in the FIG. 5.

The values of the components in the level shift circuit 31 are selected such that resistors 35 and 36 are 1.1 K$\Omega$, resistors 38 and 39 are 1 K$\Omega$, capacitor 54 is 1,000 pF and resistor 55 is 680 $\Omega$. FIG. 6 shows an open loop frequency response curve of the driver circuit for the respective cases (a) where the capacitor 54 and the resistor 55 of the phase compensation circuit 56 are set to 1,000 pF and 200 $\Omega$ respectively, (b) where the capacitor 54 and the resistor 55 are set to 1,000 pF and 680 $\Omega$, in the case (c) where the capacitor 54 and the resistor 55 are set to 10,000 pF and 680 $\Omega$, and (d) where the phase compensation circuit 56 is removed.

Figure 3:
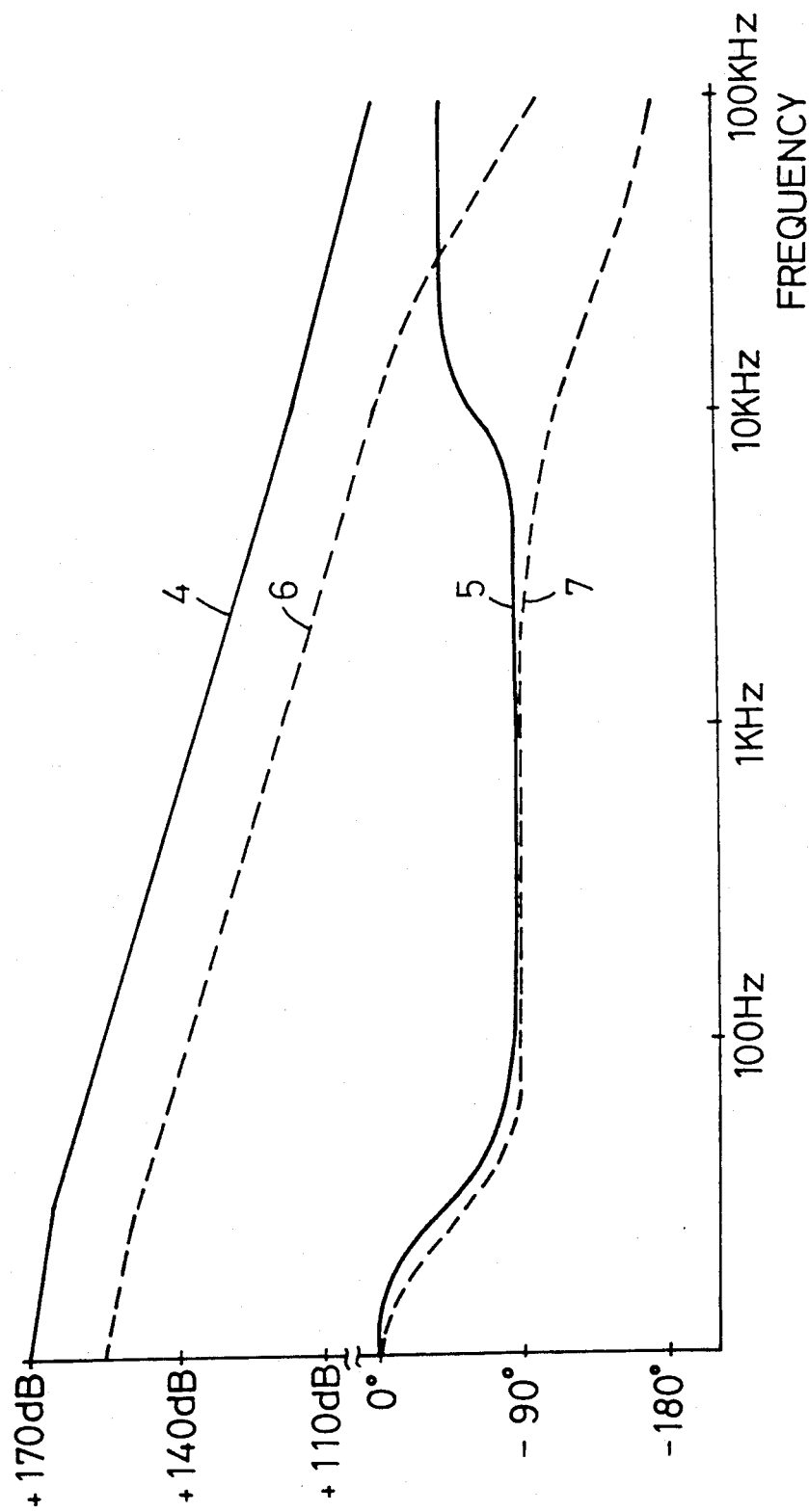
FIG. 3 shows Bode diagrams for the EIP source lock counter and the circuit in FIG. 1.
Figure 7:
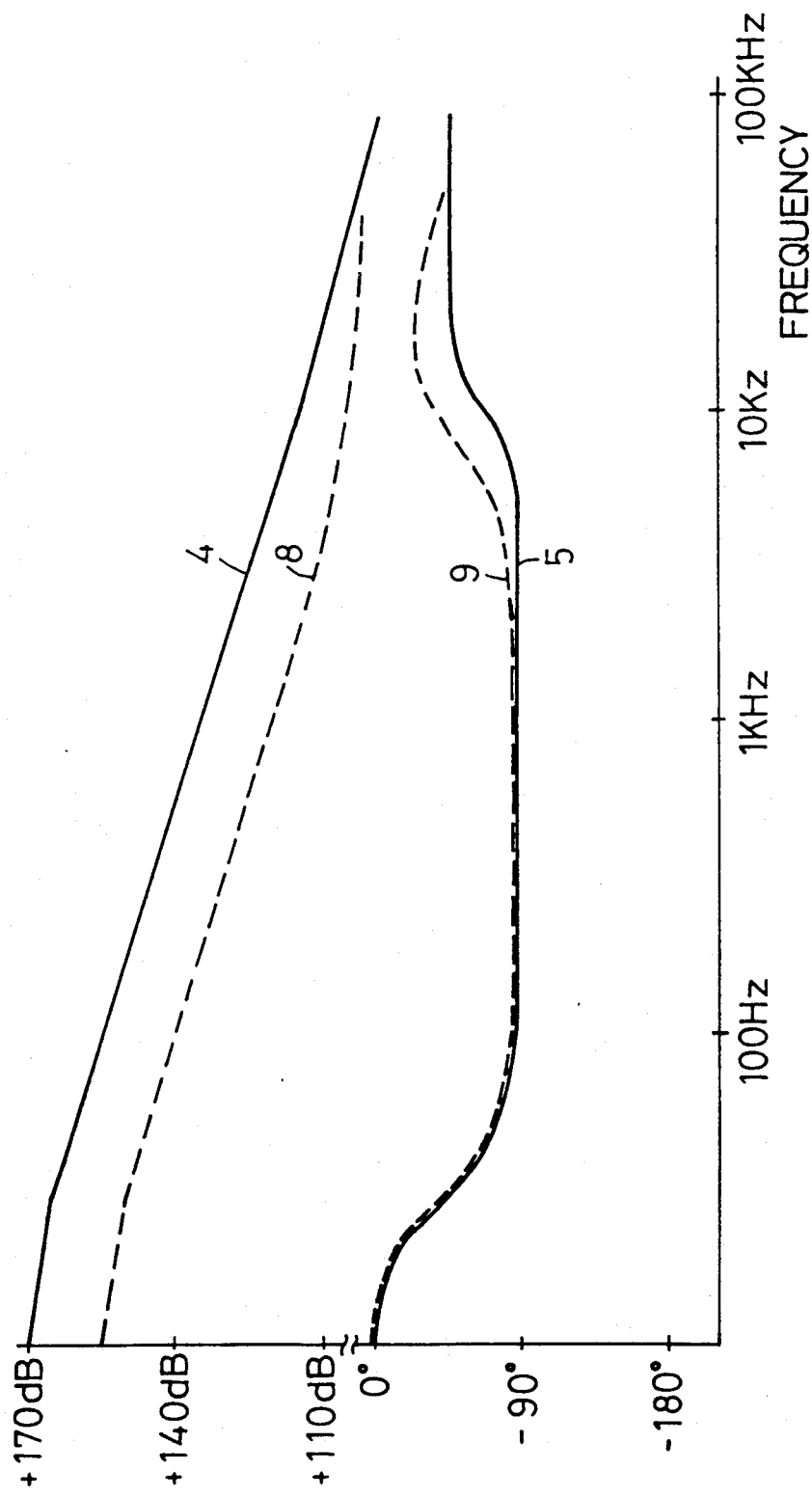
FIG. 7 is a Bode diagram of the EIP source lock counter and the circuit where the driver circuit of FIG. 1 is replaced by the circuit shown in FIG. 5.

As proven from the above curves, when the phase compensation circuit 56 is adopted, the gain increases and, at the same time, the phase advances at the high frequency region. Thus, when the driver circuit indicated in FIG. 5 is used for the driver circuit 21 in FIG. 1, it compensates the gain decrease and the phase delay at the high frequency region in the phase locked loop circuit. The case (b) in FIG. 6 is the most preferred curve in which attenuation below 2 KHz is $-15$ dB, and the attenuation gradually decreases between 2 KHz and 50 KHz. When combined with a characteristic of the loop filter 19 in the EIP source lock counter 12, it shows clearly the characteristic of a secondary filter and also advances the phase. From 50 KHz towards 700 KHz, which is a far higher frequency region than $1/\tau_2$ of the secondary filter, the attenuation characteristic is flat at $-5$ dB. The Bode diagram of the driver circuit of FIG. 5 adopting the phase compensation circuit 56 of case (b) and the EIP source lock counter 12 is shown as curves 8 and 9 in FIG. 7. The gain slope becomes gentle in the neighborhood of 10 KHz, and the gain is improved compared to the curve 6 of FIG. 3, and has much wider bandwidth than the curve 6. The phase is advanced more than the characteristic curve 5 of the EIP source lock counter 12 alone. Particularly above 10 KHz, the phase is advanced far more than the curve 7 of FIG. 3, thus a phase allowance is sufficient.

Figure 4:
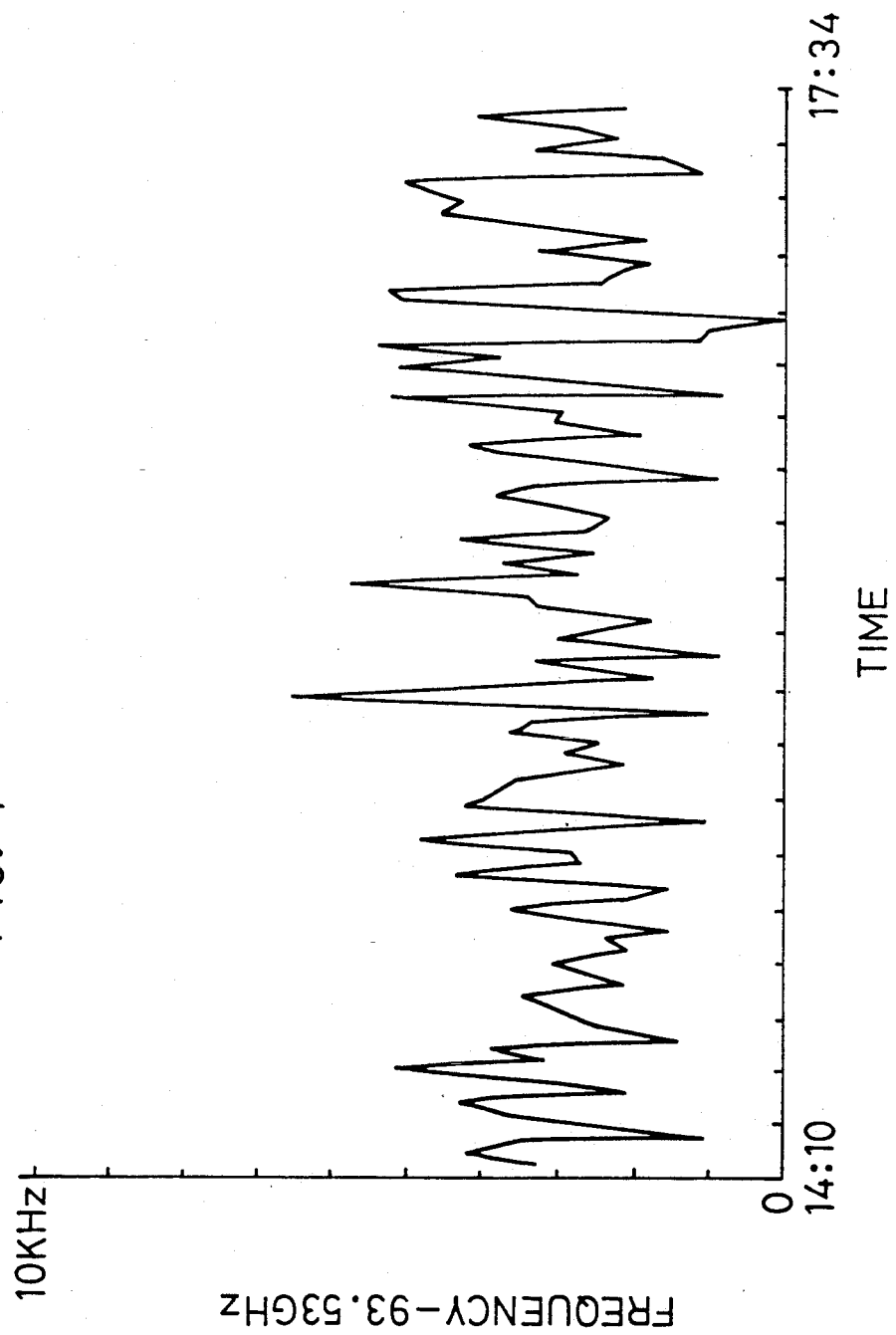
FIG. 4 is a graph of a frequency deviation of the conventional circuit illustrated in FIG. 1.
Figure 8:
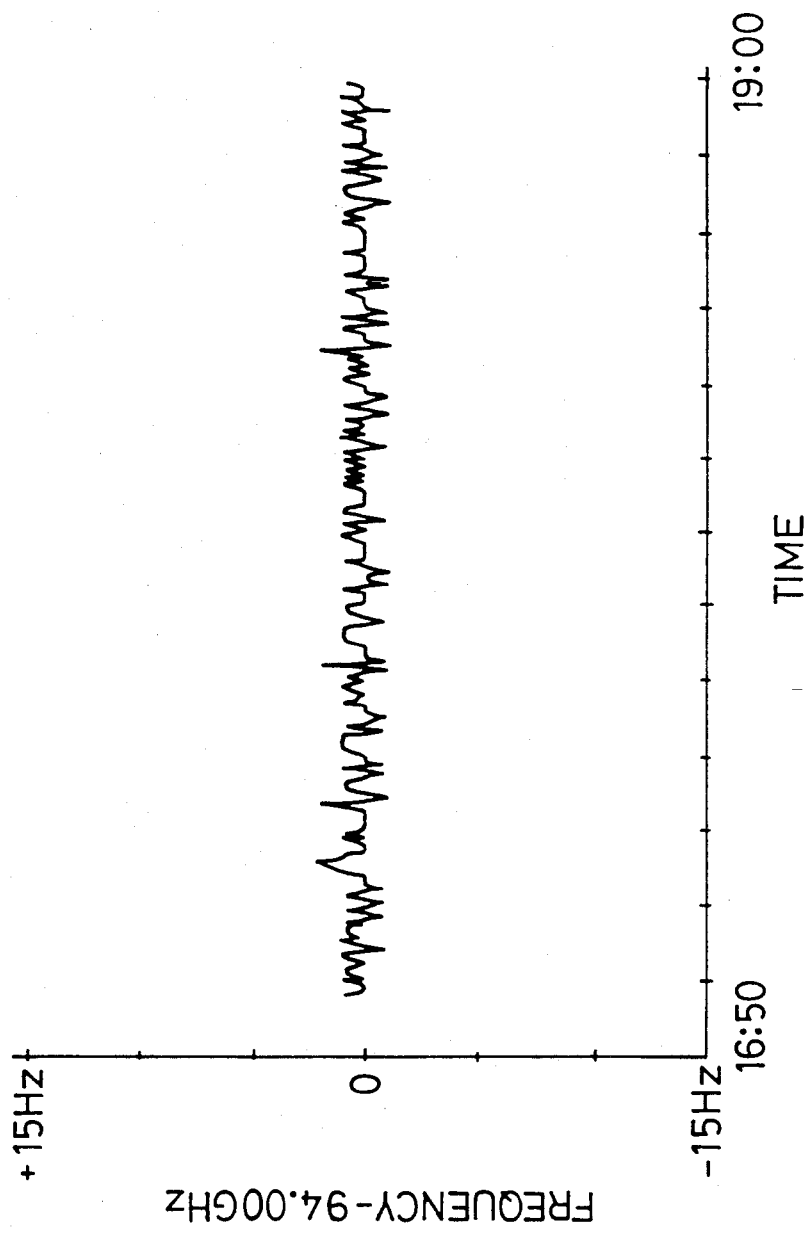
FIG. 8 is a graph of a frequency deviation in a case where the circuit shown in FIG. 5 is used for the driver circuit in FIG. 1.

Shown in FIG. 8 is a frequency deviation when the case (b) of the phase compensation circuit 56 is used and the driver circuit shown in FIG. 5 is used for the driver circuit 21 in FIG. 1. The circuit used for measuring the frequency deviation shown in FIG. 8 is the same as that used for measuring the frequency deviation shown in FIG. 4 except for the driver circuit 21. As it is easily understood if FIGS. 4 and 8 are compared, the frequency deviation by this invention is remarkably small. The frequency stability is $3 \times 10^{-11}$, and at the same time a spectrum purity at 500 KHz off the carrier is $-37$ dBc which is a significant improvement over that of the prior art, because that of the prior art has been $-22$ dBc. The damping factor $\zeta$, based on the curve 8 in FIG. 7, has been calculated by the afore-mentioned conditions. The damping factor is 1.98 which is remarkably smaller than in the prior art and also is close to an ideal response characteristic.

Figure 9:
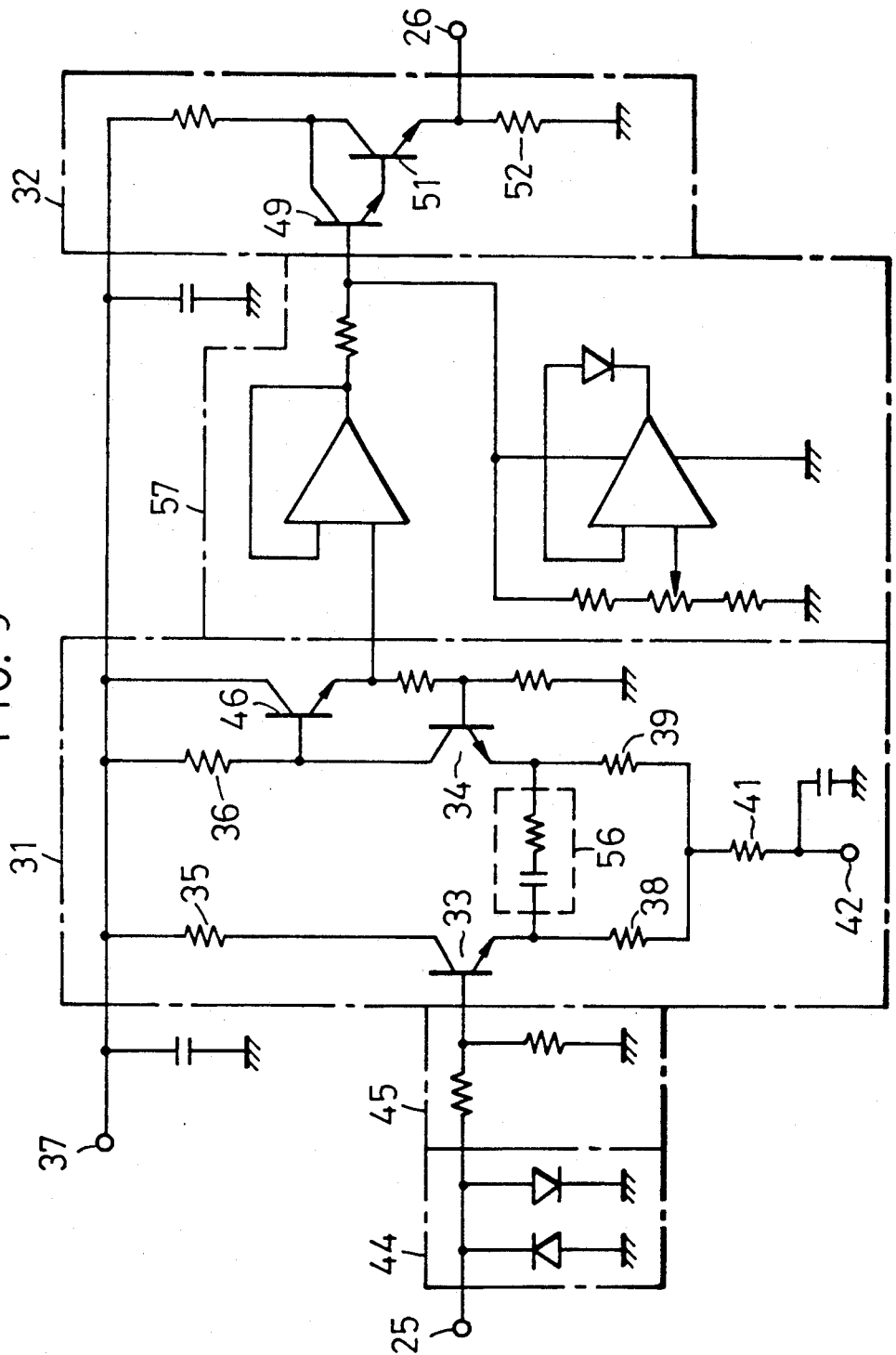
FIG. 9 is a schematic diagram of an example of the driver circuit employed in the embodiment of the present invention.
Figure 10:
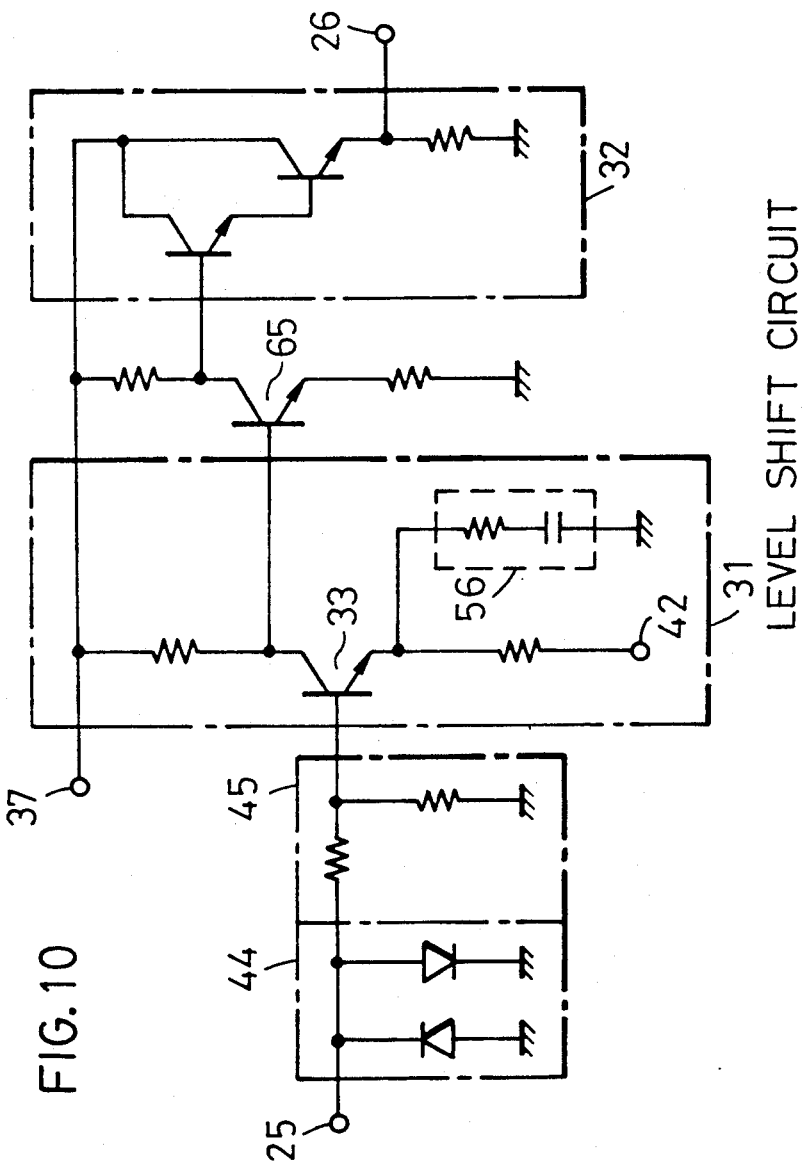
FIG. 10 is a schematic diagram of another example of the driver circuit to be employed in the embodiment of the present invention.
Figure 11:
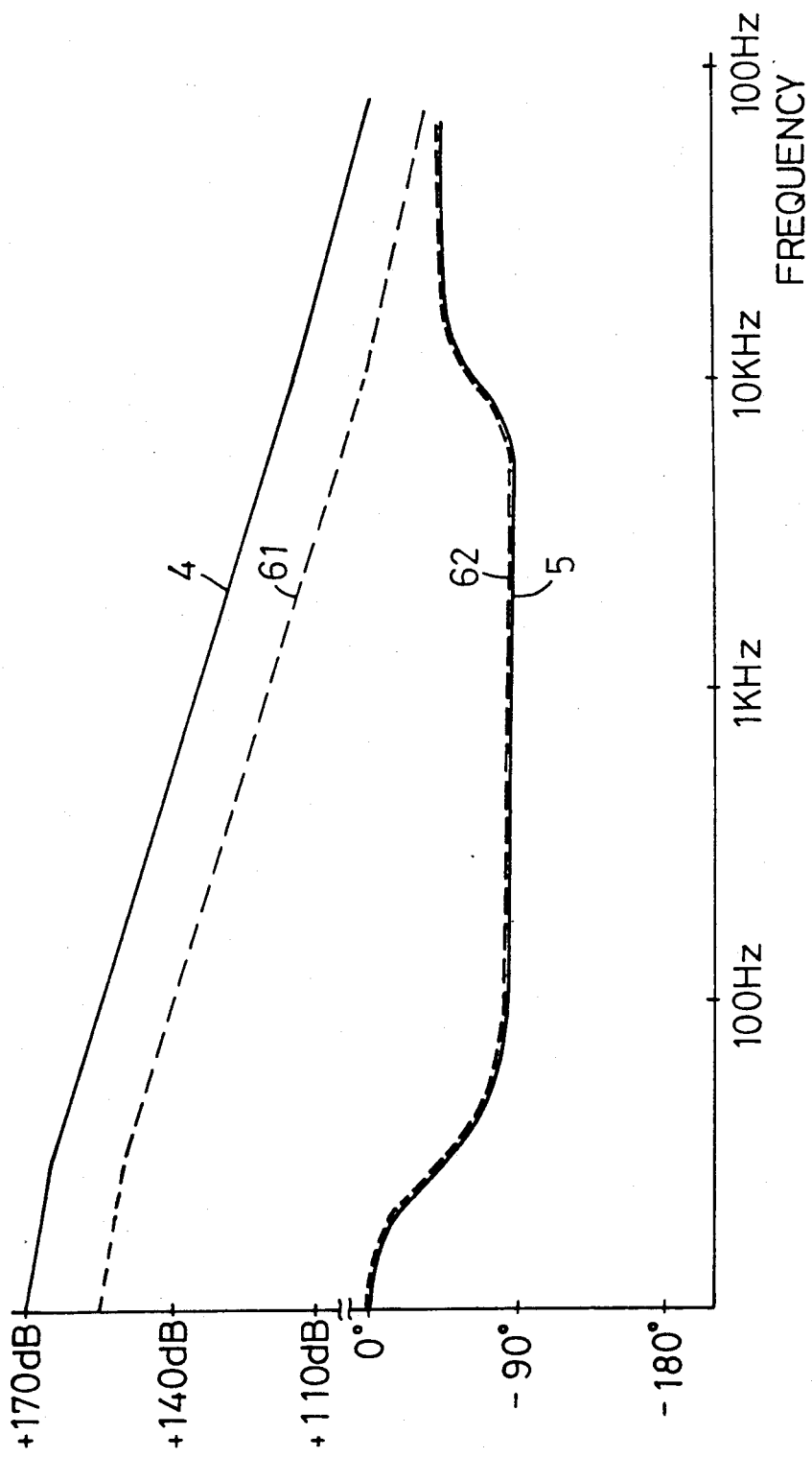
FIG. 11 shows a Bode diagram of the circuit where the driver circuit in FIG. 1 is replaced by the circuit in FIG. 5 after taking out the phase compensation circuit therein, and a Bode diagram of the EIP source lock counter.
Figure 12:
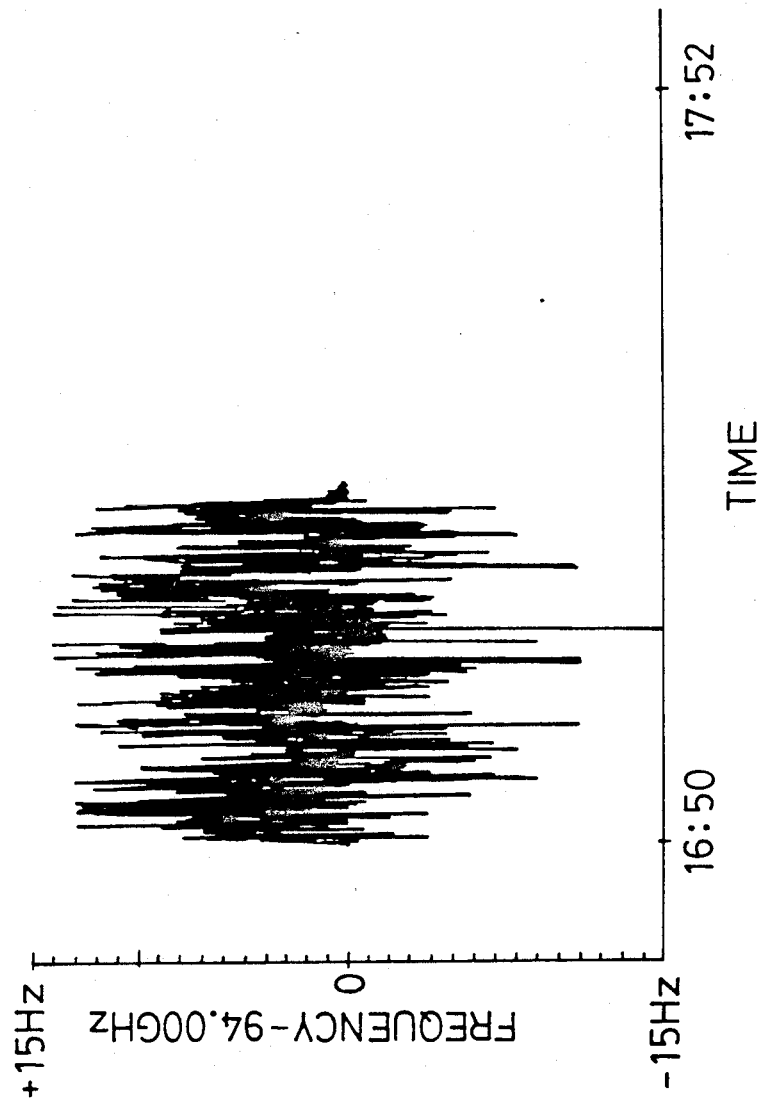
FIG. 12 is a graph of a frequency deviation for the circuit where the circuit shown in FIG. 5 after taking out the phase compensation circuit therein is used for the driver circuit shown in FIG. 1.

As shown in FIG. 9, a limiter 57 is inserted between the level shift circuit 31 and the current amplifier circuit 32, as needed, in order to protect the Gunn oscillator 11 from being supplied with an overvoltage. As shown in FIG. 10, the level shift circuit 31 may be constructed with one stage transistor 33, in which case the output of the level shift circuit 31 is supplied to the current amplifier circuit 32 after its polarity is inverted by the transistor 65 to match the polarity. An appropriate cutoff frequency $f_T$ for the transistor 65 is about 300 MHz. Whether or not to use the phase compensation circuit 56 is immaterial. The curves 61 and 62 in FIG. 11 are the Bode diagram when using the circuit shown in FIG. 5 without the phase compensation circuit 56 for the driver circuit 21 in FIG. 1, and compared to the corresponding curves 4 and 5 of the prior art. As shown the gain is increased and the phase is advanced at the high frequency region, thus providing a wider bandwidth. Based on the above configuration, a frequency deviation is shown in FIG. 12 which is approximately $\pm 15$ Hz and is significantly stabilized compared to a frequency deviation of approximate 5 KHz (FIG. 4) by the prior art. In the above description, this invention is applied to the phase locked loop circuit of the Gunn oscillator, but it can be applied to that of an IMPATT oscillator as well.

As described above, in accordance with this invention, the level shift circuit designed with the transistors having a high cutoff frequency, and the current amplifier circuit using the transistors having a high cutoff frequency to which an output of the level shift circuit thereof is supplied comprise the driver circuit. Additionally, by providing the phase compensation circuit, and using the EIP source lock counter already available commercially in the marketplace, a closed loop frequency response becomes wider band, and a response frequency becomes higher, and also the damping factor is improved. Consequently, the driver circuit thereof can follow, at a high speed, a frequency deviation of the oscillator, and can compensate the frequency deviation. Frequency stabilization by the present invention is $3 \times 10^{-11}$ which is much higher than $5 \times 10^{-8}$ of the prior art, thus when it is applied to a millimeter wave source for the Josephson junction array voltage standard, a more precise voltage standard than the prior art can be obtained.

Moreover, the present invention is highly regarded as an outstanding one by the scientific society. Theses titled "Josephson Junction Array Voltage Standard at ETL" and "Circuit Precautions for Stable Operation of Josephson Junction Array Voltage Standard" were accepted in the April, 1991 issue of The IEEE Trans. Instrum. & Meas.

What is claimed is:

1. A phase locked loop circuit having a super high frequency diode oscillator in which an oscillation output of the super high frequency diode oscillator is input to a source lock counter which operates based on a reference clock from a time base consisting of an atomic frequency standard, a phase difference between a signal corresponding to said oscillation output and a reference frequency signal set in the source lock counter is detected, an error signal corresponding to the phase difference is output from the source lock counter, and an oscillation frequency of the super high frequency diode oscillator is controlled by a feedback of the error signal, said phase locked loop circuit comprising:

a driver circuit including a level shift circuit including high frequency transistors for shifting the level of the error signal input thereto; and a current amplifier circuit, operatively connected to said driver circuit and the super high frequency diode oscillator, for amplifying the current of the level-shifted error signal and supplying it to the super high frequency diode oscillator as a control signal.

2. A phase locked loop circuit of claim 1, wherein said driver circuit comprises a phase compensation circuit for increasing a gain as well as advancing a phase in the high frequency region compared to the low frequency region.

3. A phase locked loop circuit according to claim 2, wherein said level shift circuit comprises first and second transistors having collectors connected to a positive power supply terminal through first and second resistors, respectively, and emitters connected to each other through third and fourth resistors having a junction connected to a negative power supply terminal through a fifth resistor, said error signal is supplied to a base of said first transistor, a collector output of said second transistor is supplied to said current amplifier circuit through an emitter-follower circuit, and wherein said phase compensation circuit comprises a capacitor and a sixth resistor connected in series with said capacitor and connected between each emitter of said first and second transistors.

4. A phase locked loop circuit according to claim 2 wherein said level shift circuit comprises:

a first resistor connected to a positive power supply;

a second resistor connected to the positive power supply and connected to said first resistor;

a third resistor operatively connected to a negative power supply;

a fourth resistor operatively connected to the negative power supply and connected to said third resistor;

a fifth resistor connected to a junction of said third and fourth resistors and to the negative power supply;

a first transistor having a base receiving said error signal, having a collector connected to said first resistor and having an emitter connected to said third resistor;

a second transistor having a base, having a collector connected to said second resistor and having an emitter connected to said fourth resistor; and an emitter-follower circuit operatively connected to the collector of said second transistor.

5. A phase locked loop circuit according to claim 4, wherein said phase compensation circuit comprises:

a capacitor connected to the emitter of said first transistor; and a sixth resistor connected in series with said capacitor and to the emitter of said second transistor.

6. A phase locked loop circuit according to claim 5, further comprising a limiter connected between said level shift circuit and said current amplifier circuit.

* * * * *